United States Patent [19]

Kubozoe et al.

[11] Patent Number: 4,806,767
[45] Date of Patent: Feb. 21, 1989

[54] ELECTRON LENS ASSEMBLY

[75] Inventors: Morioki Kubozoe; Hisasi Sato, both of Katsuta, Japan

[73] Assignee: Hitachi, Ltd., Tokyo, Japan

[21] Appl. No.: 68,834

[22] Filed: Jun. 11, 1987

[30] Foreign Application Priority Data

Jun. 12, 1986 [JP] Japan ................................ 61-136482

[51] Int. Cl.$^4$ ............................ G21K 1/08; H01J 3/14
[52] U.S. Cl. .............................................. 250/396 ML
[58] Field of Search ............ 250/311, 396 R, 396 ML

[56] References Cited

FOREIGN PATENT DOCUMENTS 0158539 8/1985 Japan ........................... 250/396 ML Primary Examiner—Bruce C. Anderson
Attorney, Agent, or Firm—Antonelli, Terry & Wands

[57] ABSTRACT

An electron lens assembly comprises at least a pair of magnetic pole pieces disposed in opposition to each other and each having a bore allowing an electron beam to pass therethrough, an exciting coil for producing a magnetic field between the magnetic pole pieces, a yoke coupled to the magnetic pole pieces and constituted by two divided yoke members so that the exciting coil can be accommodated, at least one of the two yoke members being detachably coupled to one of the magnetic pole pieces, and a pipe disposed along the electron beam path for defining a passage for the electron beam except for a space formed between the magnetic pole pieces. A metal O-ring is disposed on a surface of the detachable yoke member so as to prevent the air from entering the space defined between the opposite magnetic pole pieces along the surface of the detachable yoke member from a space accommodating the exciting coil. The electron beam passage defining pipe is coupled integrally to the detachable yoke member. With the electron lens structure, an ultra-high vacuum can be sustained within the column.

7 Claims, 3 Drawing Sheets

ELECTRON LENS ASSEMBLY

BACKGROUND OF THE INVENTION

The present invention relates to an electron lens assembly employed in electron microscopes and others. More particularly, the invention is concerned with an electron lens assembly of an ultra-high vacuum structure.

In general, in order that a specimen surface is to be observed in a clean state or environment within the electron microscope, it is necessary to sustain a vacuum on the order of $10^{-10}$ Torr within a space in which a specimen is placed. To this end, a so-called dry vacuum pump such as ion pump, turbo molecular pump or the like must naturally be used as the pump for generating vacuum. Further, such a column structure is required in which vacuum is generated only in the region constituting the passage for an electron beam. More specifically, the column has to be realized in such a structure in which outgassing sources such as electron lenses, deflecting coils and others are installed outside of the vacuum space by using a lining tube. Besides, in precedence to the use of the electron microscope, it is indispensable to heat the evacuated portions for the purpose of de-gassing $H_2O$ or other molecules therefrom.

Except for the objective lens, all structural components of other electron lenses inclusive of magnetic pole pieces can be installed outside of the vacuum space in a relatively simple arrangement since there is no necessity to insert any objects in these other electron lenses externally of the microscope. In contrast, in the case of the electron lens to serve as the objective lens, a specimen holder inclusive of a specimen, an objective aperture, cold fingers and others must be inserted between the magnetic pole pieces constituting parts of the objective lens. Thus, the objective lens is necessarily of a much complicated structure and presents many difficulties in creating the vacuum environment when compared with the other electron lenses.

FIG. 1 of the attached drawings is a cross-sectional view showing a hitherto known structure of the objective lens assembly, wherein reference numeral 1 denotes an upper yoke member, 2 denotes a lower yoke member, 3 denotes an exciting coil, 4 denotes an upper magnetic pole piece, 5 denotes a lower magnetic pole piece, 6 denotes a coupling member of a non-magnetic material for combining together the magnetic pole pieces 4 and 5 in an integral structure, and 7 denotes a lens holddown member. The elements 1, 2, 4, 5 and 7 cooperate to constitute a magnetic circuit, wherein a magnetic field is generated between the magnetic pole pieces 4 and 5, which serves as an electron lens. A specimen 8 is disposed between the magnetic pole pieces 4 and 5. The lens hold-down member 7 and the magnetic pole pieces 4 and 5 have respective bores formed therein to allow an electron beam to pass therethrough. The lower yoke member 7 is of a cylindrical structure having a hollow interior or through-hole for allowing the electron beam having passed through the electron lens constituted by the magnetic pole pieces 4 and 5 to pass through the yoke member 7. In operation, the electron beam enters the objective lens structure from above the lens holddown member 7 and passes through an electron beam passage pipe 9 disposed within the hollow space defined by the through-hole to run to the succeeding stage of electron lens. Reference numeral 10 denotes a spacer formed of a non-magnetic material and provided with transverse bores 11 and 11' through which a specimen holder, objective aperture and others can be inserted. Reference numeral 12 denotes an O-ring for coupling the upper yoke member 1 to a portion of the column (not shown) to be disposed on the yoke member 1 in a vacuum-tight manner, 13 denotes an O-ring for joining vacuum-tightly the lower yoke member 2 and the spacer 10, and numerals 14 and 15 denote vacuum-tightly sealing O-rings for allowing an astigmatism correction element 16 to be disposed at a location close to the lower magnetic pole piece 5. Reference numeral 17 denotes a weld for joining vacuum-tightly the upper yoke member 1 and the spacer 10 by Heliarc welding. Accordingly, the upper yoke member 1 and the spacer 10 are realized in an integral structure such that they cannot be mechanically separated from each other. In contrast, the vacuum-tight connection between the lower yoke member 2 and the spacer 10 is assured by an O-ring seal 13, because it is necessary that the upper yoke member 1 and the lower yoke member 2 can be separated for accommodating the exciting coil 3.

As will be seen from the above description, the vacuum tightness of the prior known electron lens assembly at the locations in the vicinity of the specimen is supposed to be assured by using the O-ring seals 13 to 15 which are each formed of a high molecular material having a melting point of about 150° C. such as fluorine rubber commercially available under the designation "Byton" or the like. Accordingly, these O-ring seals are incapable of withstanding the heating at a temperature of about 200° C. which is required for realizing an ultra-high vacuum on the order of $10^{-10}$ Torr. Further, the air may enter the electron lens assembly through these O-ring seals of the rubber material. Thus, the electron lens of the structure known heretofore suffers a problem that the ultra-high vacuum can not be attained.

The inventors of the present invention have precedently proposed in JP-A-No. 60-158539 an objective lens structure in which these O-ring seals are eliminated. The objective lens structure according to this precedent proposal is shown in FIG. 2 of the accompanying drawings.

Referring to FIG. 2, a gap is formed between a lower magnetic pole piece 5 and a lower yoke member 2, wherein a spacer 10 is so disposed as to extend into a space within the lower yoke member 2 by taking advantage of the gap so that the spacer can be connected to an electron beam path defining pipe 9 by welding. This structure is based on the results of experiments conducted by the inventors which showed that when the gap is at most about a tenth part of the inter-pole distance between the upper and lower magnetic pole pieces, no significant adverse influence is exerted to performance of the electron beam by the gap defined between the lower magnetic pole piece 5 and the lower yoke member 2. More specifically, since the inter-pole distance is about 10 mm, the distance between the lower magnetic pole piece 5 and the lower yoke member 2 can be held less than 1/10 of the inter-pole distance, provided that the extension of the spacer 10 has a thickness not greater than 0.5 mm.

However, inspection conducted later on has proven that the thickness of the extension of the spacer on the order of 0.5 mm is inadequate for attaining the vacuum of $10^{-10}$ Torr because of penetration of the air or other gases. Further, it is a matter of cause that it is most preferable that there is provided no such gap.

SUMMARY OF THE INVENTION

It is an object of the present invention to provide an electron lens assembly which can well withstand the heating at a temperature of about 200° C. and thus allows an ultra-high vacuum to be realized.

Another object of the present invention is to provide an electron lens assembly of a structure capable of withstanding an ultra-high vacuum.

In view of the above objects, there is provided according to an aspect of the present invention an electron lens assembly which comprises at least a pair of magnetic pole pieces disposed in opposition to each other and each having a bore allowing an electron beam to pass therethrough, an exciting coil for producing a magnetic field between the magnetic pole pieces, a yoke coupled to the magnetic pole pieces and constituted by two divided parts or yoke members so that the exciting coil can be accommodated, at least one of the two yoke members being detachably coupled to one of the magnetic pole pieces, and a pipe disposed along the electron beam path for defining a passage for the electron beam except for a space defined between the magnetic pole pieces, wherein a metal O-ring is disposed on a surface of the detachable yoke member so as to prevent the air from entering the space defined by the opposite magnetic pole pieces along the surface of the detachable yoke member from a space accommodating the exciting coil, and the electron beam passage defining pipe is coupled integrally to the detachable yoke member.

With the structure of the electron lens assembly mentioned above in which the electron beam passage defining pipe is integrally coupled to the yoke by welding, provision of an O-ring at this portion is rendered unnecessary, as in the case of the preceding proposal shown in FIG. 2. Thus, the electron lens assembly is imparted with the capability of fully withstanding the heating at a temperature of about 200° C. Further, because the extension of the spacer required in the structure shown in FIG. 2 is rendered unnecessary, there arises no problem of penetration of the air through the extension of the spacer. Besides, since the yoke accommodating the exciting coil is realized by the separable yoke members combined through interposition of a metal O-ring which is excellent in the heat withstanding capability and the vacuum tight property, the electron lens assembly can sustain an ultra-high vacuum in addition to the capability of withstanding the heating at a temperature on the order of 200° C.

DESCRIPTION OF THE PREFERRED EMBODIMENTS

Now, the invention will be described in detail in conjunction with an illustrative embodiment by referring to FIGS. 3 and 4.

Figure 1:
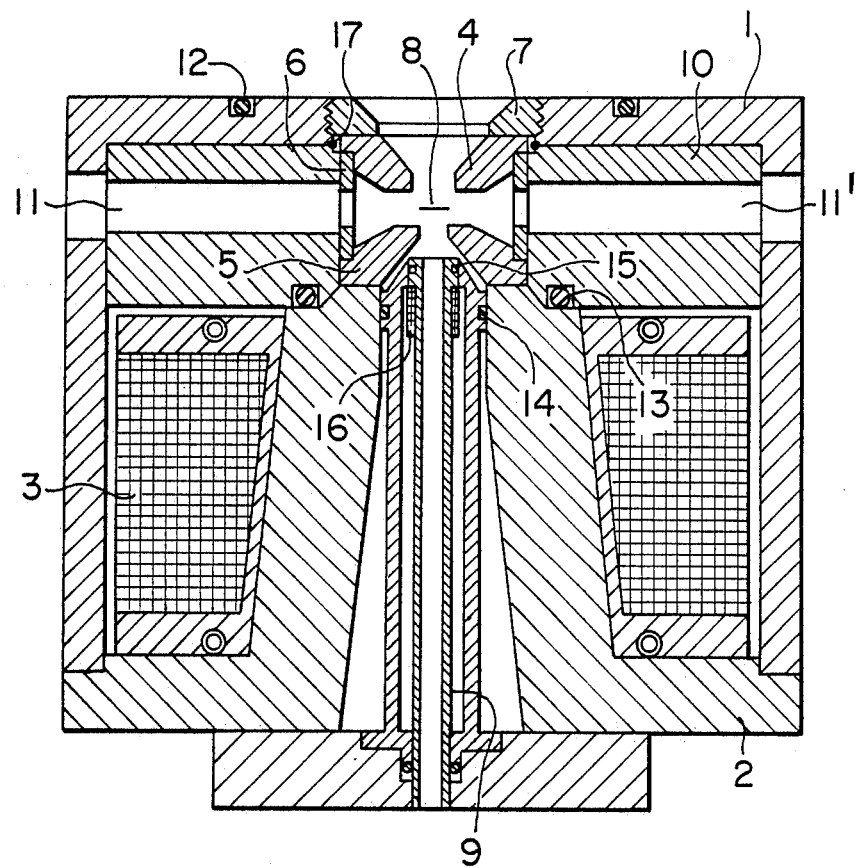
FIGS. 1 and 2 are views showing structures of hitherto known electron lens assemblies, respectively.
Figure 2:
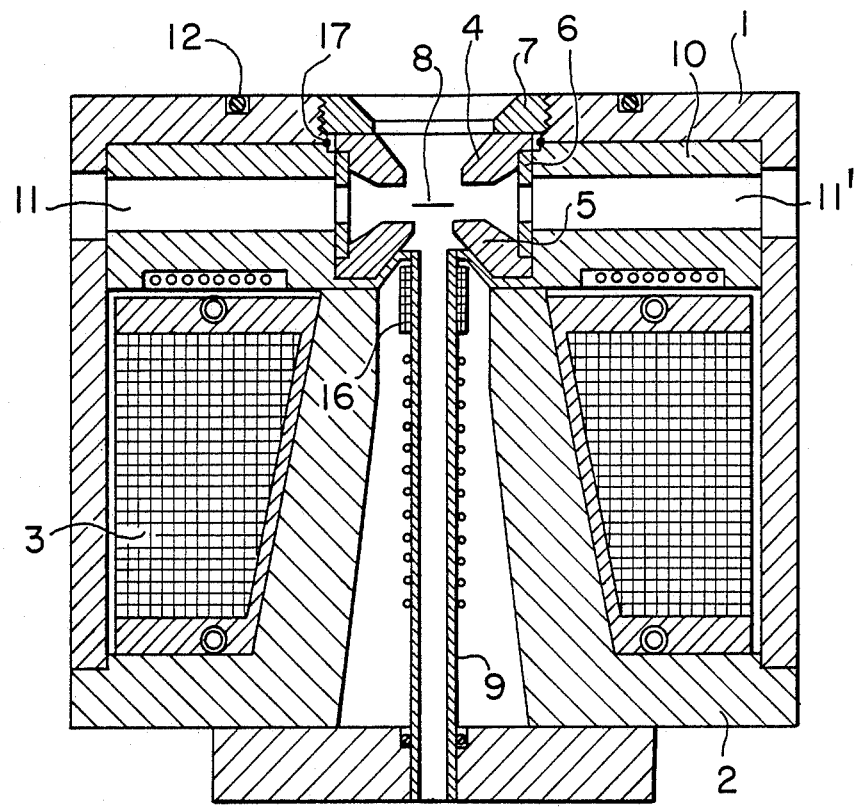
Figure 3:
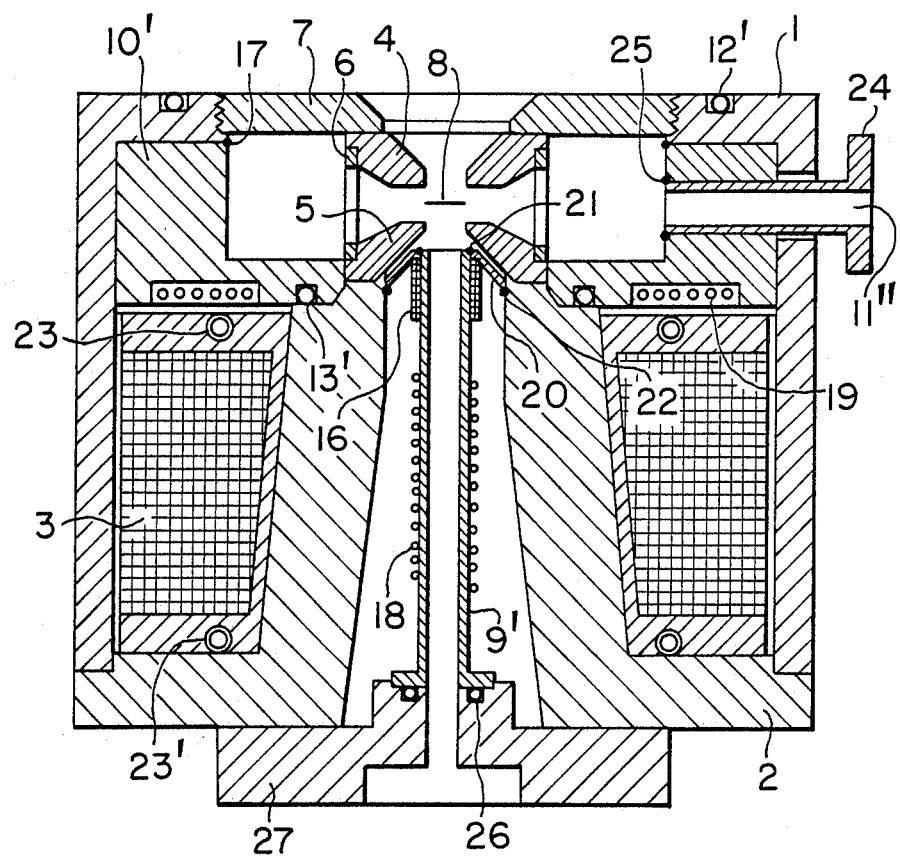
FIG. 3 is a view showing an electron lens assembly according to an exemplary embodiment of the present invention

FIG. 3 is a sectional view of an electron lens assembly according to an embodiment of the invention. Parenthetically, it is to be noted that like elements or parts are attached with like reference characters throughout all the drawings, and description is not repeated, unless it is necessary.

Referring to FIG. 3, a lower yoke member 2 and an electron beam passage defining pipe 9' are welded together by way of a non-magnetic member (interconnecting member) 20 by Heliarc or the like welding at portions where the yoke member 2 and the pipe 9' are located close to each other, as indicated by 21 and 22, whereby the lower yoke member 2 and the pipe 9' are implemented in an integral structure. The non-magnetic member 20 may be implemented in a sufficient thickness to prevent penetration of gases therethrough (e.g. thickness of about 1 to 1.5 mm). On the other hand, an O-ring 13' which is disposed between the lower yoke member 2 and the spacer 10' for the purpose of realizing a vacuum tight sealing is constituted by a metal O-ring. In this connection, it should be mentioned that when a metal gasket such as of copper, aluminum or the like is employed, a clamping force of very great magnitude is required and besides an additional clamping must be performed later on in view of poor resiliency. In contrast, the metal O-ring exhibits a high resiliency and requires no additional clamping, to advantage.

Figure 4:
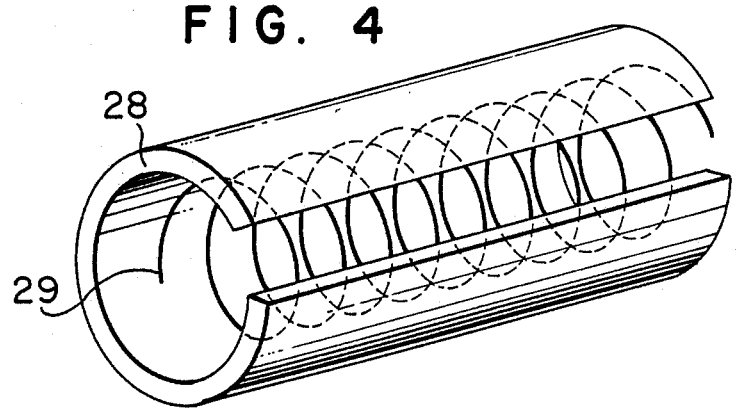
FIG. 4 is a view showing schematically a metal O-ring preferable for the employment in the electron lens assembly according to the present invention.

FIG. 4 shows schematically in a fragmental perspective view a exemplary structure of the metal O-ring suited advantageously for the use in the electron lens assembly according to the present invention. As will be seen in the figure, the metal O-ring is constituted by a cylindrical pipe 28 of aluminum having a slot-like cutout of notch extending longitudinally of the pipe. A helical spring 29 of stainless steel is disposed within the cylindrical pipe 28. (Parenthetically, this type of metal O-ring is commercially available from Cefilac Company of France and Usui Kokusai Sangyo K.K. of Japan under designation "Helicoflex".)

Turning back to FIG. 3, reference numeral 24 denotes a metal flanged pipe, and 11" denotes a transverse bore for mounting the objective aperture, cold fingers and others. In the case of the illustrative embodiment under consideration, the objective aperture or other member is mounted on the flange of the flanged pipe 24 with an O-ring or the like being interposed while the metal flanged pipe 24 is welded to the spacer 10 by Heliarc or the like welding as indicated by 25 for maintaining the vacuum. An O-ring 12' for sealing vacuum tightly the connection between the upper yoke member 1 and a portion of the column (not shown) disposed on the yoke member 1 is also constituted by a metal O-ring similarly to the O-ring 13'.

On the other hand, the electron beam passage defining pipe 9' is realized in an integral structure with the lower yoke member 2. In that case, if the pipe 9' projects beyond the bottom surface of the lower yoke member 2, inconvenience will be involved in the handling. Accordingly, in the case of the illustrative embodiment, the electron beam passage defining pipe 9' is so implemented as not to project beyond the bottom surface of the lower yoke member 2, wherein the lower end of the pipe 9' is coupled to a lower spacer 27 with an O-ring 26 being interposed therebetween. For the purpose of degassing by heating, there is disposed a heater 18 at a location adjacent to the pipe 9', while another heater 19 is disposed on the bottom side of the spacer 10, as shown in FIG. 3. Additionally, cooling pipes 23 and 23' are disposed above and below the coil 3 for dissipating heat generated by the coil 3 when it is electrically energized.

With the structure described above, the vacuum state within the specimen chamber in which a specimen 8 is disposed can be sustained satisfactorily by means of the welds formed by Heliarc or the like welding and the metal O-rings. Since the metal O-ring can well withstand a high temperature of 200° C. or higher, it is possible to produce the vacuum on the order of $10^{-10}$ Torr.

It should be mentioned that a Xe-lamp or the like may be disposed within the space adjacent to the spacer 10 for degassing purpose in addition to the degassing heaters 18 and 19. Further, the Heliarc welding for realizing the vacuum tight seal may be replaced by other method such as oven blazing or other. In particular, the bonding between the non-magnetic member 20 and the lower yoke member 2 can be advantageously realized by the oven blazing method according to which a blazing material such as silver or the like is disposed in a ring-like pattern on the portions to be bonded and heated subsequently within an oven filled with an inert gas such as argon or the like. In a modification, the electron beam passage defining pipe 9' may be formed integrally with the non-magnetic member 20 and welded to the lower yoke member 2 at the portion indicated by 22. Alternatively, the electron beam passage defining pipe 9' may be directly welded to the lower yoke 2 without resorting to the use of the interconnecting non-magnetic member 20.

The electron lens assembly of the structure described above can well withstand the heating at a temperature of about 200° C. and allows the ultra-high vacuum to be easily produced.

We claim:

1. An electron lens assembly, comprising:
   at least two magnetic pole pieces disposed in opposition to each other and each having a bore for allowing an electron beam to pass therethrough, said magnetic pole pieces defining a space therebetween;
   an exciting coil for generating a magnetic field between said magnetic pole pieces;
   a yoke constituted by at least two divided yoke members so as to be capable of accommodating said exciting coil and coupled to said magnetic pole pieces, at least one of said divided yoke members being coupled detachably to one of said magnetic pole pieces;
   a metal O-ring disposed on a surface of said detachable yoke member so as to prevent the air from penetrating into the space defined between said magnetic pole pieces along said surface of said detachable yoke member from a space accommodating said exciting coil therein; and
   an electron beam passage defining pipe disposed along an electron beam path except for said space defined by said magnetic pole pieces, said pipe being integrally coupled to said detachable yoke member at an end portion near to the magnetic pole piece located close to said pipe.

2. An electron lens assembly according to claim 1, wherein said pipe is directly welded to said detachable yoke member at the end portion near to said magnetic pole piece located near to said pipe.

3. An electron lens assembly according to claim 1, wherein said pipe is welded to said detachable yoke member through an interconnecting member at the end portion of the pipe located near to said detachable magnetic pole piece.

4. An electron lens assembly according to claim 1, wherein said metal O-ring includes a metal pipe having a cut-out portion extending longitudinally, and a helical spring disposed within said metal pipe.

5. An electron lens assembly, comprising:
   first and second magnetic pole pieces disposed in opposition to each other and each having a bore for allowing an electron beam to pass therethrough;
   a yoke including a first yoke portion and a second yoke portion separable from said first yoke portion, said first yoke portion having one end magnetically coupled to said first magnetic pole piece and the other end, said second yoke portion having one end magnetically and separably coupled to said second magnetic pole piece and the other end magnetically coupled to said other end of said first yoke portion, said second yoke portion further including an exciting coil disposed around outer periphery of said second yoke portion, said second yoke portion having a through-hole formed therein for allowing the electron beam having passed through said first and second pole pieces to pass through said yoke;
   a pipe disposed within the through-hole formed in said second yoke portion so as to enclose the electron beam passing through said through-hole, said pipe being formed integrally with said second yoke portion in the vicinity of said one end of said second yoke portion;
   a non-magnetic spacer having first and second ends connected gas-tightly to said first and second yoke portions, respectively, said exciting coil being disposed within a space defined by said spacer and said first and second yoke portions; and
   a metal O-ring disposed between said second end of said spacer and said second yoke portion for coupling separably and gas-tightly said spacer and said second yoke portion to each other.

6. An electron lens assembly according to claim 5, wherein said pipe is directly welded to said second yoke portion.

7. An electron lens assembly according to claim 5, wherein said pipe is welded to said second yoke portion through an interconnecting member.

* * * * *